United States Patent
Nadkarni et al.

(10) Patent No.: US 11,223,359 B2
(45) Date of Patent: Jan. 11, 2022

(54) POWER EFFICIENT VOLTAGE LEVEL TRANSLATOR CIRCUIT

(71) Applicant: QUALCOMM Incorporated, San Diego, CA (US)

(72) Inventors: Rahul Krishnakumar Nadkarni, Cary, NC (US); Anthony Correale, Jr., Raleigh, NC (US)

(73) Assignee: Qualcomm Incorporated, San Diego, CA (US)

( * ) Notice: Subject to any disclaimer, the term of this patent is extended or adjusted under 35 U.S.C. 154(b) by 191 days.

(21) Appl. No.: 15/087,812

(22) Filed: Mar. 31, 2016

(65) Prior Publication Data

US 2017/0288673 A1 Oct. 5, 2017

(51) Int. Cl.
| | |
|---|---|
| *G06F 1/3296* | (2019.01) |
| *H03K 19/0185* | (2006.01) |
| *H03K 3/356* | (2006.01) |
| *H03K 3/012* | (2006.01) |
| *H03K 19/00* | (2006.01) |
| *H03K 19/017* | (2006.01) |

(52) U.S. Cl.
CPC ... *H03K 19/018521* (2013.01); *G06F 1/3296* (2013.01); *H03K 3/012* (2013.01); *H03K 3/35613* (2013.01); *H03K 3/356147* (2013.01); *H03K 19/0016* (2013.01); *H03K 19/01707* (2013.01)

(58) Field of Classification Search
CPC ............................ H03K 19/018521; G06F 1/32
USPC .................................................. 713/300, 320
See application file for complete search history.

(56) References Cited

U.S. PATENT DOCUMENTS

| | | | |
|---|---|---|---|
| 7,005,889 B2 | 2/2006 | Sowden et al. | |
| 7,109,779 B2 | 9/2006 | Tahara et al. | |
| (Continued) | | | |

FOREIGN PATENT DOCUMENTS

| | | |
|---|---|---|
| CN | 1825766 A | 8/2006 |
| CN | 101262219 A | 9/2008 |
| (Continued) | | |

OTHER PUBLICATIONS

International Search Report and Written Opinion—PCT/US2017/021935—ISA/EPO—dated Jun. 13, 2017.

(Continued)

*Primary Examiner* — Paul Yen
(74) *Attorney, Agent, or Firm* — Muncy, Geissler, Olds & Lowe, P.C.

(57) ABSTRACT

Disclosed systems and methods relate to a power efficient voltage level translator. In a normal mode wherein a first supply voltage of the first voltage domain and a second supply voltage of the second voltage domain are different, the voltage level translator translates an input signal in a first voltage domain to an output signal in a second voltage domain. In a bypass mode wherein the first supply voltage and the second supply voltage are substantially the same, a bypass circuit is configured to bypass the voltage level translator and provide the input signal as the output signal in the first voltage domain, thus avoiding delay introduced by the voltage level translator in the bypass mode. Further, a power-down circuit is configured to power-down the voltage level translator in the bypass mode but not in the normal mode.

24 Claims, 6 Drawing Sheets

(56) References Cited

U.S. PATENT DOCUMENTS

| | | | |
|---|---|---|---|
| 7,230,475 B2* | 6/2007 | Choi | G11C 5/143 327/544 |
| 7,733,126 B1 | 6/2010 | Choy et al. | |
| 7,884,645 B2 | 2/2011 | Chen et al. | |
| 8,111,088 B2 | 2/2012 | Srivastava et al. | |
| 8,339,177 B2 | 12/2012 | Jarrar et al. | |
| 8,570,077 B2 | 10/2013 | Kwon et al. | |
| 8,598,936 B2 | 12/2013 | Kuge | |
| 2003/0179032 A1 | 9/2003 | Kaneko et al. | |
| 2005/0077919 A1* | 4/2005 | Sowden | G06F 1/3203 326/62 |
| 2005/0184761 A1 | 8/2005 | Isomura | |
| 2005/0270065 A1 | 12/2005 | Bhattacharya et al. | |
| 2006/0192587 A1* | 8/2006 | Bhattacharya | H03K 3/012 326/80 |
| 2008/0054979 A1 | 3/2008 | Nagumo | |
| 2008/0238522 A1 | 10/2008 | Thorp et al. | |
| 2012/0187998 A1* | 7/2012 | Jarrar | H03K 19/018521 327/333 |
| 2013/0154712 A1 | 6/2013 | Hess et al. | |
| 2014/0184300 A1 | 7/2014 | Wu | |
| 2015/0109045 A1 | 4/2015 | Vilangudipitchai et al. | |
| 2016/0036441 A1 | 2/2016 | Dey et al. | |
| 2016/0150171 A1* | 5/2016 | Raynor | H04N 5/345 348/302 |
| 2017/0012627 A1* | 1/2017 | Kapoor | H03K 19/018507 |

FOREIGN PATENT DOCUMENTS

| | | | |
|---|---|---|---|
| CN | 101682328 A | | 3/2010 |
| CN | 102324923 A | | 1/2012 |
| CN | 102624373 A | | 8/2012 |
| CN | 104169826 A | | 11/2014 |
| CN | 104811180 A | | 7/2015 |
| EP | 0590247 A2 | | 4/1994 |
| GB | 2406924 A | | 4/2005 |
| JP | H11084274 A | | 3/1998 |
| JP | H111195975 A | | 7/1999 |
| JP | 2001036398 A | | 2/2001 |
| JP | 2003218687 A | | 7/2003 |
| JP | 2003283327 A | | 10/2003 |
| JP | 2005117628 A | | 4/2005 |
| JP | 2006238449 A | | 9/2006 |
| JP | 2007228330 A | | 9/2007 |
| JP | 2007306042 A | | 11/2007 |
| WO | WO-2009097315 A1 | | 8/2009 |
| WO | 2011136964 | | 11/2011 |
| WO | 2012083288 | | 6/2012 |

OTHER PUBLICATIONS

Tran C.Q. et al., "Low-Power High-Speed Level Shifter Design for Block-Level Dynamic Voltage Scaling Environment", Integrated Circuit Design and Technology, ICICDT 2005, International Conference on Austin, TX, USA May 9-11, 2005, Piscataway, NJ, USA, IEEE, May 9, 2005 (May 9, 2005), pp. 229-232, XP010832287.

Hosseini S.R., et al., "An Energy-Efficient Level Shifter for Low-Power Applications," Jul. 30, 2015, 2015 IEEE International Symposium on Circuits and Systems (ISCAS), pp. 2241-2244.

* cited by examiner

FIG. 1A
CONVENTIONAL

FIG. 1B
CONVENTIONAL

POWER EFFICIENT VOLTAGE LEVEL TRANSLATOR CIRCUIT

FIELD OF DISCLOSURE

Disclosed aspects relate to voltage supply for processing systems. More specifically, exemplary aspects are directed to a power efficient voltage level translator circuit for voltage level translation between a first voltage domain and a second voltage domain.

BACKGROUND

Modern processing systems (e.g., a system-on-chip or "SOC") may include a variety of subsystems or components which can have different frequency and power considerations. Correspondingly, different sections of the SOC may be provided with different supply voltages. For example, a memory system may include memory cells (e.g., static random access memory or "SRAM" cells) that may be supplied with a higher supply voltage, whereas logic cells of a central processing unit (CPU) or processor core can support lower supply voltages. Accordingly, the SOC may be designed with two or more voltage islands or voltage domains (e.g., logic voltage domain, memory voltage domain, etc.), each voltage domain with a corresponding voltage supply tailored to suit the voltage considerations of the components (e.g., logic cells, memory cells, etc.) in the voltage domain.

There may be signals which cross two voltage domains, for example, a read or write command issued by a CPU in a logic voltage domain to a memory system in a memory voltage domain. For such signals, a translation circuit, known as a "voltage level translator" in the art, may be provided to translate a signal from a first voltage domain to a second voltage domain. However, in some cases, the voltages of one or more voltage domains may be dynamically scaled, which could result in supply voltages of the first and second voltage domains to be equal or substantially the same (e.g., in a "turbo mode," as known in the art, wherein a previously low supply voltage of the logic voltage domain may be scaled to a higher supply voltage to operate the logic cells at a higher frequency, and wherein the higher supply voltage of the logic voltage domain may be substantially the same as the supply voltage of the memory voltage domain). In such cases, there would be no need for a voltage level translator between the first and second voltage domains because the supply voltages of the first and second voltage domains are substantially the same.

However, in conventional designs, the voltage level translator may nevertheless remain active and unnecessarily perform voltage translation of the signal between the first and second voltage domain even if the supply voltages of the first and second voltage domains are substantially the same. By remaining active and in the signal's path, the voltage level translator consumes power and adds delay in the signal's path at all times, even when voltage level translation is not needed.

SUMMARY

Exemplary aspects of the invention are directed to systems and methods for a power efficient voltage level translator. In a normal mode wherein a first supply voltage of the first voltage domain and a second supply voltage of the second voltage domain are different, the voltage level translator translates an input signal in a first voltage domain to an output signal in a second voltage domain. In a bypass mode wherein the first supply voltage and the second supply voltage are substantially the same, a bypass circuit is configured to bypass the voltage level translator and provide the input signal as the output signal in the first voltage domain, thus avoiding delay introduced by the voltage level translator in the bypass mode. Further, a power-down circuit is configured to power-down the voltage level translator in the bypass mode but not in the normal mode.

For example, an exemplary aspect is directed to an apparatus comprising a voltage level translator configured to translate an input signal in a first voltage domain to an output signal in a second voltage domain, in a normal mode wherein a first supply voltage of the first voltage domain is different from a second supply voltage of the second voltage domain, a bypass circuit configured to bypass the voltage level translator and provide the input signal as the output signal in the first voltage domain, in a bypass mode wherein the first supply voltage and the second supply voltage are substantially the same, and a power-down circuit configured to power-down the voltage level translator in the bypass mode but not in the normal mode.

Another exemplary aspect is directed to a method of voltage level translation, the method comprising translating, in a voltage level translator, an input signal in a first voltage domain to an output signal in a second voltage domain, in a normal mode wherein a first supply voltage of the first voltage domain is different from a second supply voltage of the second voltage domain, bypassing the voltage level translator and providing the input signal as the output signal in the first voltage domain in a bypass mode, wherein the first supply voltage and the second supply voltage are substantially the same, and powering-down the voltage level translator in the bypass mode but not in the normal mode.

Yet another exemplary aspect is directed to an apparatus comprising means for translating an input signal in a first voltage domain to an output signal in a second voltage domain, in a normal mode wherein a first supply voltage of the first voltage domain is different from a second supply voltage of the second voltage domain, means for bypassing the means for translating, and providing the output signal in the first voltage domain in a bypass mode, wherein the first supply voltage and the second supply voltage are substantially the same, and means for powering-down the voltage level translator in the bypass mode but not in the normal mode.

BRIEF DESCRIPTION OF THE DRAWINGS

The accompanying drawings are presented to aid in the description of aspects of the invention and are provided solely for illustration of the aspects and not limitation thereof.

DETAILED DESCRIPTION

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to a voltage level translator configured to convert a signal from a first voltage domain to a second voltage domain. In the event that the first voltage domain is equal to the second voltage domain, a selective bypass circuit is included to bypass the voltage level translator to avoid delay introduced by the voltage level translator in the signal's path between the first and second voltage domains. Furthermore, in exemplary aspects, power control circuits may be included to power down or shut off the voltage level translator when the voltage level translator is bypassed in the above-described manner Thus, in exemplary aspects, power consumption and delay associated with the voltage level translator can be avoided when the voltage level translator is not needed in a signal's path. These and related aspects will now be explained with reference to the figures, in the following sections.

Firstly, with reference to FIGS. 1A-B, a conventional voltage level translator 100 will be described. Voltage level translator 100 is configured to translate complementary input signals a 114 and a_n 116 in a first voltage domain supplied by a first supply voltage VDD1 to an output signal z 120 in a second voltage domain supplied by a second supply voltage VDD2. Without loss of generality, first supply voltage VDD1 may be less than the second voltage supply VDD2 under normal operating conditions, while in some instances, the first and second voltage supplies VDD1 and VDD2 may be substantially the same voltage values. Although specific conditions under which the first and second voltage supplies VDD1 and VDD2 may assume the different values or the manner in which these voltage supplies are generated are not germane to this discussion, an example can pertain to the first voltage domain comprising a processor core of a processing system, or the like, with logic cells, wherein the first voltage supply VDD1 may be referred to as a logic supply voltage, and the second voltage domain comprising a memory system with memory cells, wherein the second voltage supply VDD2 may be referred to as a memory supply voltage.

Figure 1A:
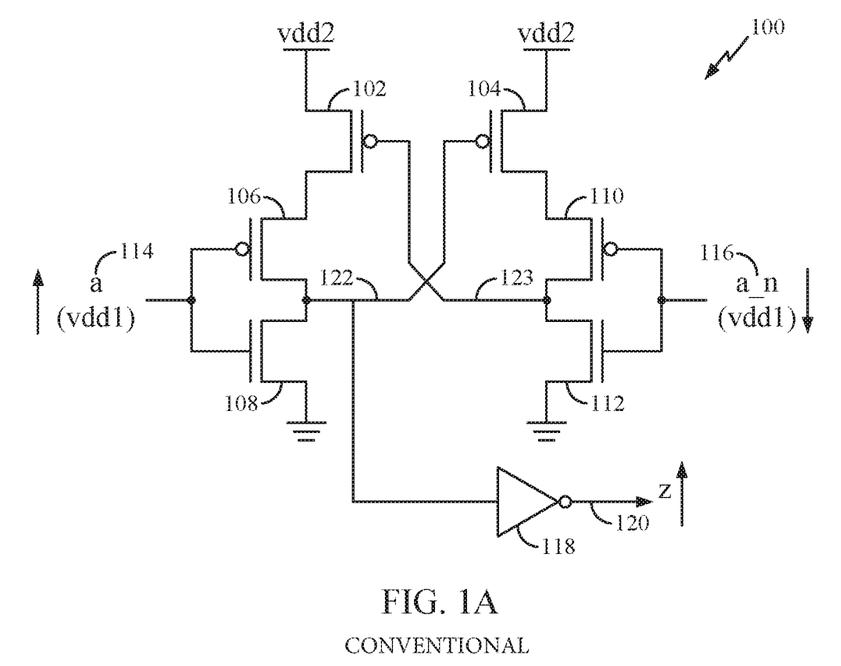
FIGS. 1A-B illustrate a conventional voltage level translator.
Figure 1B:
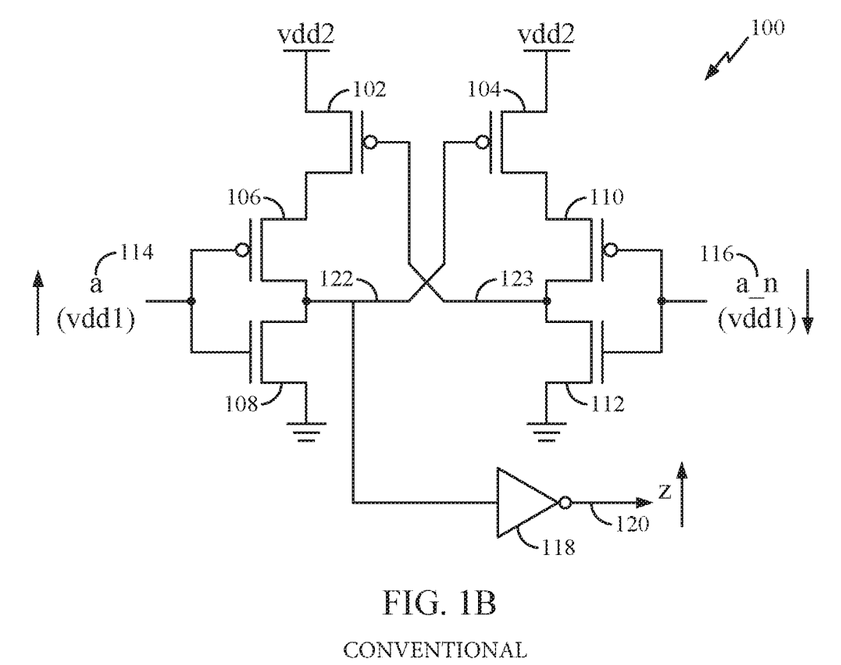

In the configuration illustrated in FIGS. 1A-B, voltage level translator 100 comprises pull-up transistors 102 and 104, which may be configured with p-channel metal oxide semiconductor (PMOS) devices or p-channel field effect transistors (PFETs); pull-down transistors 108 and 112 which may be configured with n-channel metal oxide semiconductor (NMOS) devices or n-channel field effect transistors (NFETs); and pull-up transistors 106 and 110 which may be configured as PMOS devices or PFETs. The output of the voltage level translation of complementary input signals a 114 and a_n 116 may be derived from node 122, which passed through inverter 118 can provide output signal z 120. Although the operational details of voltage level translator 100 as illustrated in FIGS. 1A-B are well-known, some brief details will be provided in the following sections, keeping in mind that various other configurations of voltage level translators are possible for which the exemplary aspects of this disclosure can be applied.

Referring to FIG. 1A, a case where input signal a 114 is rising or transitions from a low logic state (e.g., binary "0") to a high logic state (e.g., binary "1"), and correspondingly, and input signal a_n 116 is falling is illustrated. Correspondingly, in a first stage, pull-up transistor 106 will start to shut off and pull-down transistor 108 will start to turn on, which starts to discharge node 122. On the other side, input signal a_n 116 falls and shuts off pull-down transistor 112 while turning on pull-up transistor 110. Once node 122 falls to a sufficiently low value, in a second stage, pull-up transistor 104 turns on and pull-up transistors 104 and 110 start to charge node 123 to the second supply voltage VDD2.

As node 123 charges up, pull-up transistor 102 starts to shut off which assists pull-down transistor 108 to pull node 122 further down. Node 122 being pulled down assists the process of pull-up transistor 104 being turned on, which further charges up node 123. Eventually, pull-up transistor 102 is completely shut off and node 122 transitions to a logical state of "0", while node 123 transitions to a logical "1" in the second voltage domain. Nodes 122 and 123 maintain their logical states of "0" and "1" until a subsequent change in the values of complementary input signals a 114 and a_n 116 takes place.

Thus, the inverted value of node 122, after passing through inverter 118, appears as output signal z 120, which rises in the second voltage domain, corresponding to the rise of input signal a 114 and fall of input signal a_n 116 in the first voltage domain. The above-identified stages of voltage level translator 100 introduce corresponding delays or latency in the path between complementary input signals a 114 and a_n 116, and output signal z 120.

With reference now to FIG. 1B, the opposite scenario, where input signal a 114 falls and a_n 116 rises will now be described. In this case, pull-up transistor 110 will start to shut off and pull-down transistor 112 will start to turn on, thus discharging node 123. On the other side, as input signal a 114 falls, pull-down transistor 108 is caused to be shut off, while turning on pull-up transistor 106. Once node 123 falls to a sufficiently low value, in a second stage, pull-up transistor 102 turns on and pull-up transistors 102 and 106 start to charge node 122 to the second supply voltage VDD2. As node 122 charges up, pull-up transistor 104 is caused to shut off which helps pull-down transistor 112 to pull node 123 further down. Node 123 being pulled down assists in pull-up transistor 102 being turned on, which further charges up node 122. Eventually, pull-up transistor 104 completely shuts off and node 123 transitions to a logical state of "0" while node 122 transitions to a logical state of "1" in the second voltage domain. The logical state of node 122 is inverted by inverter 118, to appear as falling output signal z 120 in the second voltage domain. Nodes 122 and 123 maintain their logical states of "1" and "0", respectively, until a subsequent transition occurs on complementary input signals a 114 and a_n 116. As can be seen, the above-identified stages involved in the operation of voltage level translator 100 in this case also causes significant delays.

For cases where the difference between voltage values of the first and second supply voltages VDD1 and VDD2 is large, the stack of pull-up transistors 102 and 106 on the left hand side of voltage level translator 100 may be weakened in order to allow pull-down transistor 108, for example, to effectively pull down node 122 for the case where input signal a 114 rises (or transitions from low to high) and correspondingly, input signal a_n 116 falls (or transitions from high to low). Similarly, the stack of pull-up transistors 104 and 110 on the right hand side of voltage level translator 100 may be weakened in order to allow pull-down transistor 112 to effectively pull-down node 123 for the case where input signal a 114 falls and correspondingly, input signal a_n 116 rises. This relative sizing of pull-down and pull-up transistors may further increase the delay from the complementary input signals a 114 and a_n 116 and output signal z 120.

From the above discussions of voltage level translator 100, it can be appreciated that in both cases, shown in FIGS. 1A-B, there is considerable delay introduced. Furthermore, the multiple stages of turning on and off the various pull-up and pull-down transistors also consumes power. In the event the first voltage supply VDD1 of the first voltage domain and the second voltage supply VDD2 of the second voltage domain are substantially the same, the delay and power associated with voltage level translator 100 can be avoided in exemplary aspects which will now be discussed with reference to FIGS. 2A-B.

Figure 2A:
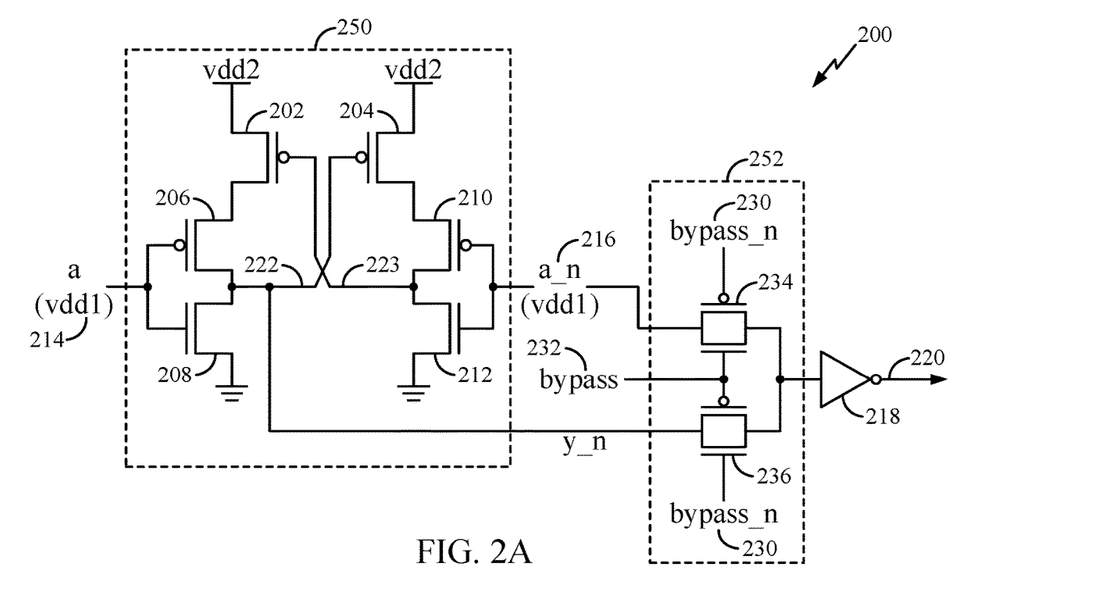
FIGS. 2A-D illustrate circuits related to a voltage level translator, according to exemplary aspects of this disclosure.

Referring to FIG. 2A, circuit 200 is shown, which comprises voltage level translator 250 and bypass circuit 252. Voltage level translator 250 may be configured to be similar to the conventional voltage level translator 100 described with reference to FIGS. 1A-B, or any other voltage level translator configuration suitable for translating complementary input signals a 214 and a_n 216 in a first voltage domain supplied by a first voltage supply VDD1 to an intermediate output signal y_n derived at node 222 in a second voltage domain supplied by a second voltage supply VDD2. In an example aspect, the first voltage domain corresponds to a logic voltage domain comprising logic cells and the second voltage domain corresponds to a memory voltage domain comprising memory cells.

In aspects where the configuration of voltage level translator 250 is similar to the configuration of voltage level translator 100, components of voltage level translator 250 may have similar functionality as corresponding components of voltage level translator 100, and so operational details of voltage level translator 250 will not be repeated for the sake of brevity. Briefly, pull-up transistors 202, 204, 206, 210 and pull-down transistors 208, 212 of voltage level translator 250, may be configured similarly as corresponding pull-up transistors 102, 104, 106, 110 and pull-down transistors 108, 112 of voltage level translator 100. Accordingly, nodes 222 and 223 may receive voltages translated to the second voltage domain based on rise and fall of complementary input signals a 214 and a_n 216 in like manner as nodes 122 and 123 based on rise and fall of complementary input signals a 114 and a_n 116 as described in FIGS. 1A-B.

Further, circuit 200 may involve several modes of operation. For example, a normal mode of operation may be defined to include the situations where the first voltage supply VDD1 is different from (e.g., less than or greater than) the second voltage supply VDD2, and voltage level translation of complementary input signals a 214 and a_n 216 from the first voltage domain to the second voltage domain is desired. In the normal mode, the functionality of voltage level translator 250 may be substantially similar to the functionality of voltage level translator 100.

A second mode of operation of circuit 200 is defined as a bypass mode, wherein the first voltage supply VDD1 is substantially the same as the second voltage supply VDD2, and so voltage level translation of complementary input signals a 214 and a_n 216 from the first voltage domain to the second voltage domain can be avoided in the bypass mode. The bypass mode may correspond, for example to the previously mentioned turbo mode wherein supply voltages of the first voltage domain (e.g., a logic voltage domain) and the second voltage domain (e.g., a memory voltage domain) may be equal or substantially the same. In this context, substantially equal would be understood by those having skill in the art as a voltage difference between the first voltage domain and the second voltage domain small enough such that devices in the higher voltage domain that should be turned off do not turn on enough to cause unwanted leakage current. In the bypass mode, bypass circuit 252 may be employed in order to bypass voltage level translator 250 and thereby avoid the delay that may be incurred by complementary input signals a 214 and a_n 216 traversing through voltage level translator 250.

In some aspects, bypass circuit 252 may be implemented as a multiplexer or selector for selecting, in the bypass mode, input signal a_n 216 as the output of bypass circuit 252; and in the normal mode, node 222 appearing as intermediate signal y_n, as the output of bypass circuit 252. To this end, bypass circuit 252 may include two transmission-gate circuits 234 and 236, each formed by a parallel coupling of a PFET and an NFET device. The signal, bypass 232 may be asserted if circuit 200 is to be operated in the bypass mode. The compliment of bypass 232 is shown as the signal bypass_n 230. If bypass 232 is high, then bypass_n 230 is low, and transmission-gate circuit 234 is turned on to pass a_n 216 to the output of bypass circuit 252. On the other hand, if bypass 232 is low, then bypass_n 230 is high and transmission-gate circuit 236 is turned on to pass the intermediate signal y_n (i.e., node 222) to the output of bypass circuit 252. The output of bypass circuit 252 is inverted by inverter 218 to appear as output signal z 220 of circuit 200. Accordingly, in bypass mode, (e.g., when bypass 232 is asserted based on the first and second supply voltages VDD1 and VDD2 being substantially the same), a_n 216 can be selected as the output of bypass circuit 252 while completely bypassing voltage level translator 250 and corresponding delays.

Figure 2B:
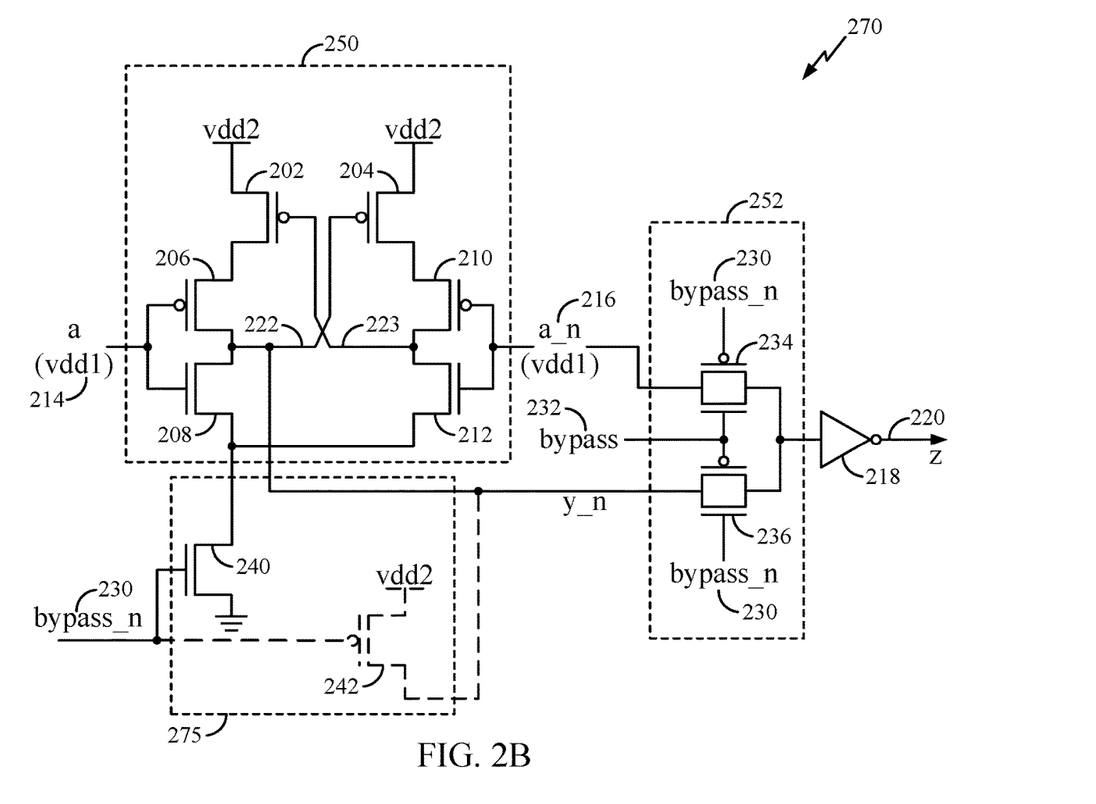
Figure 2C:
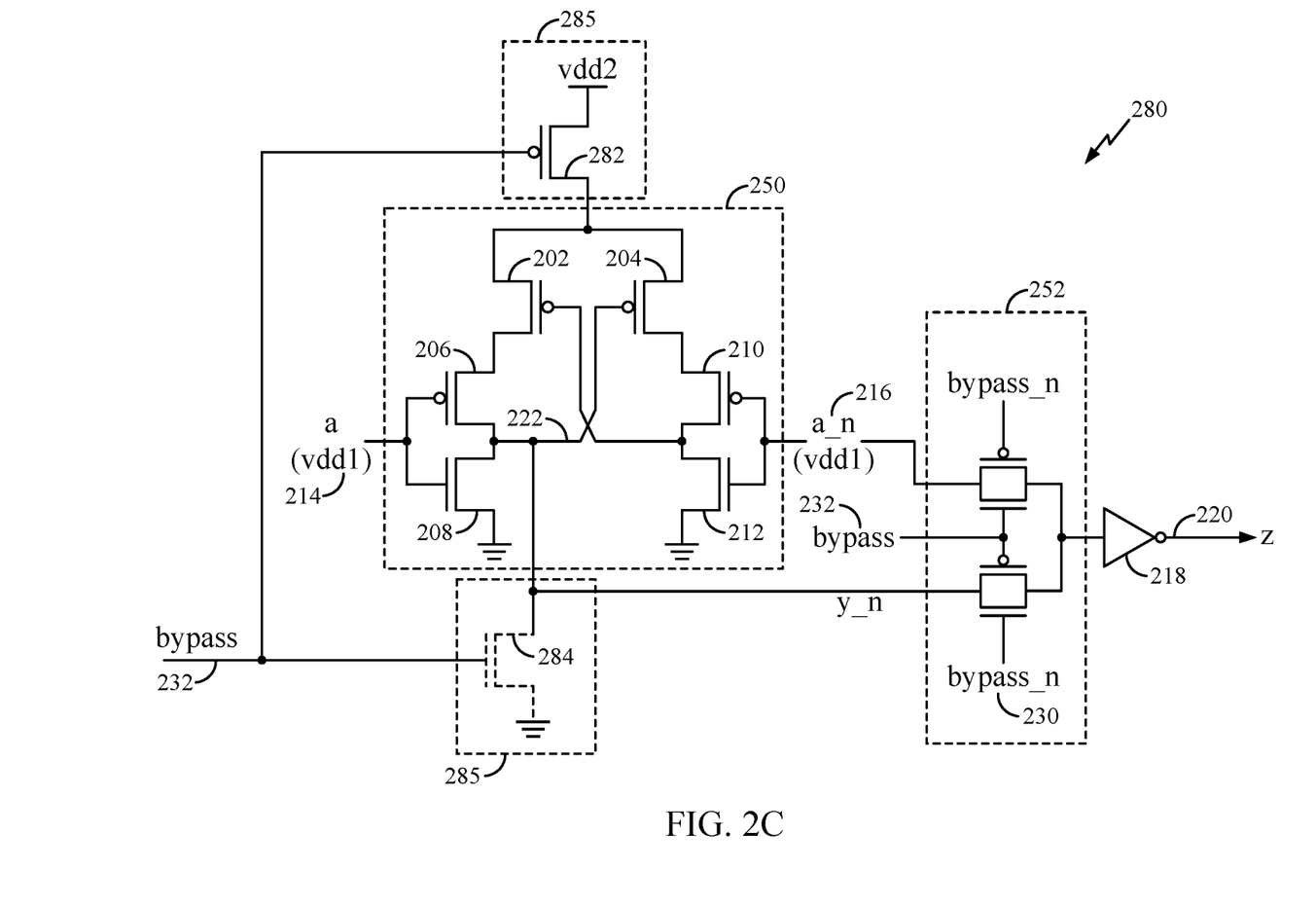
Figure 2D:
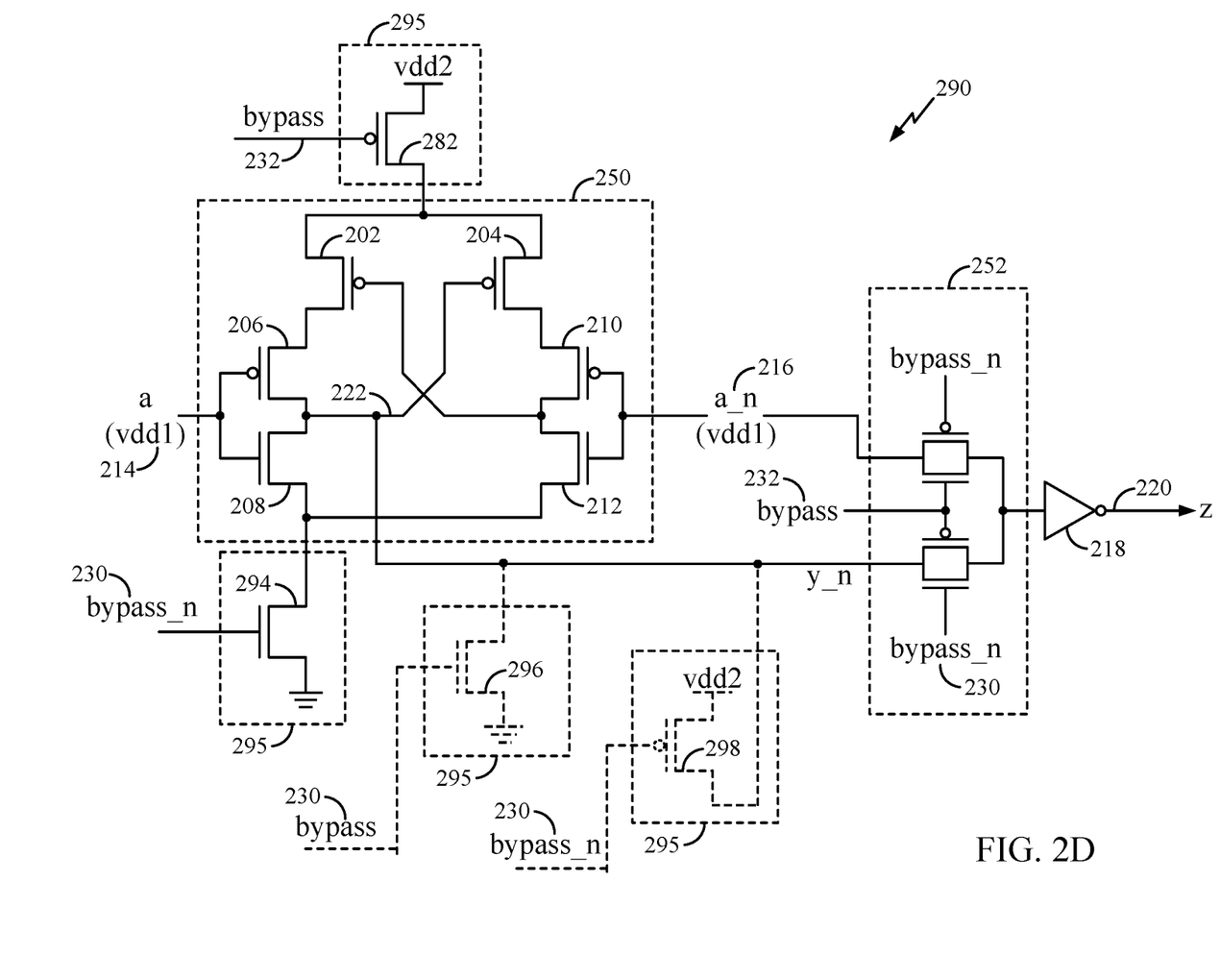

FIGS. 2B-D illustrate exemplary aspects related to power down circuits which may be used for power savings in the bypass mode. The power down circuits may be selectively deployed when bypass 232 is asserted and voltage level translator 250 is bypassed, as explained in detail in the following sections.

Firstly with reference to FIG. 2B, circuit 270 is illustrated, according to an exemplary aspect of power savings in the bypass mode. Circuit 270 includes power-down circuit 275 added to circuit 200 of FIG. 2A. In more detail, circuit 270 also includes voltage level translator 250 and bypass circuit 252 as discussed with reference to FIG. 2A above, and power-down circuit 275 is coupled to voltage level translator 250 as shown. In the bypass mode, when bypass 232 is asserted, power-down circuit 275 is configured to selectively power down voltage level translator 250. But in the normal mode, when bypass 232 is not asserted (or in other words, when bypass_n 230 is asserted), power-down circuit 275 keeps voltage level translator 250 active for normal operation. Power-down circuit 275 will be explained in further detail below.

As shown, power-down circuit 275 includes first pull-down transistor 240 (e.g., an NMOS transistor or NFET). First pull-down transistor 240 is connected in series to each one of pull-down transistors 208 and 212 of voltage level translator 250 and to ground, with the gate of first pull-down transistor 240 controlled by bypass_n 230. Thus, in normal mode, when bypass 232 is not asserted and bypass_n 230 is asserted, first pull-down transistor 240 is turned on, which connects source terminals of pull-down transistors 208 and 212 to ground, thus retaining the normal configuration of voltage level translator 250, or in other words, causing voltage level translator 250 to remain active. On the other hand, in the bypass mode, bypass 232 is asserted, causing bypass_n 230 to be driven low and turning off first pull-down transistor 240, in turn, gating off the path to ground for pull-down transistors 208 and 212 and causing voltage level translator 250 to be powered down.

Power-down circuit 275 can also include first pull-up transistor 242 (e.g., a PMOS transistor or PFET), but this may be optional. When included in power-down circuit 275, first pull-up transistor 242 is connected to intermediate signal y_n (or node 222) of voltage level translator 250 and to the second supply voltage VDD2, with the gate of first pull-up transistor 242 also controlled by bypass_n 230. In the normal mode, bypass 232 is low and bypass_n 230 is asserted, thus turning off first pull-up transistor 242, which does not affect the normal configuration of voltage level translator 250. On the other hand, in the bypass mode, bypass 232 is asserted, causing bypass_n 230 to be driven low and turning on first pull-up transistor 242, thus connecting node 222 to the second supply voltage VDD2 and turning off pull-up transistor 204. Therefore it is seen that, first pull-up transistor 242, when included, does not cause node 222 to float in the bypass mode (by connecting node 222 to second supply voltage VDD2), which leads to a reduction in back coupling in bypass circuit 252, thereby improving performance of circuit 270 in the bypass mode. Correspondingly, power supply from second voltage supply VDD2 to pull-up transistor 210 and pull-down transistor 212 is also cut off in the bypass mode.

Thus, in the bypass mode when bypass_n 230 is asserted, the combined effect of turning off first pull-down transistor 240 and turning on first pull-up transistor 242 is to isolate all the switching transistors of voltage level translator 250 from power supply, thus powering-down voltage level translator 250. Accordingly, when voltage level translator 250 is bypassed (e.g., when the first and second supply voltages VDD1 and VDD2 are substantially the same), voltage level translator 250 is also powered down, resulting in power savings.

In cases where power-down circuit 275 does not include first pull-up transistor 242, intermediate signal y_n coupled to node 222 will be caused to float during the bypass mode, but voltage level translator 250 would still remain powered down because first pull-down transistor 240 would be gated off as previously described. Not including the first pull-up transistor 242 in power-down circuit 275 may reduce an area associated with power-down circuit 275.

Next, with reference to FIG. 2C, circuit 280 is illustrated, according to another exemplary aspect of power savings in the bypass mode. Like circuit 270, circuit 280 also includes a power-down circuit, identified as power-down circuit 285 in this case, added to circuit 200 of FIG. 2A. In more detail, circuit 280 also includes voltage level translator 250 and bypass circuit 252 as discussed with reference to FIG. 2A above, and power-down circuit 285 is coupled to voltage level translator 250 as shown. In the bypass mode, when bypass 232 is asserted, power-down circuit 285 is configured to selectively power down voltage level translator 250. But in the normal mode, when bypass 232 is not asserted (or in other words, when bypass_n 230 is asserted), power-down circuit 285 keeps voltage level translator 250 active for normal operation. Power-down circuit 285 will be explained in further detail below.

As shown, power-down circuit 285 includes second pull-up transistor 282 coupled between the second supply voltage VDD2 and voltage level translator 250 (e.g., to pull-up transistors 202 and 204 of voltage level translator 250, as shown), with the gate of second pull-up transistor 282 controlled by bypass 232. In the bypass mode, when bypass 232 is high, second pull-up transistor 282 is turned off, thus gating off the voltage supply from the second supply voltage VDD2 to voltage level translator 250, and causing node 222 and the signal y_n to float. Otherwise, in the normal mode, bypass 232 is low causing second pull-up transistor 282 to be turned on and connecting second supply voltage VDD2 to voltage level translator 250 as normal.

Power-down circuit 285 can optionally include second pull-down transistor 284 (e.g., an NMOS transistor or NFET) connected to node 222 of voltage level translator 250, with the gate of second pull-down transistor 284 controlled by bypass 232. When second pull-down transistor 284 is configured in this manner, in the bypass mode, when bypass 232 is high, second pull-down transistor 284 is turned on, connecting node 222 or the signal y_n to ground or logic "0". Therefore, second pull-down transistor 284 can also prevent node 222 from floating in the bypass mode, reducing back coupling in bypass circuit 252, thereby improving performance of circuit 280 in the bypass mode. In the normal mode, bypass 232 is low causing second pull-down transistor 284 to be turned off, removing any influence on node 222 or signal y_n.

With now reference to FIG. 2D, circuit 290 is illustrated, according to yet another exemplary aspect of power savings in the bypass mode. Like circuits 270 and 280, circuit 290 also includes a power-down circuit, identified as power-down circuit 295 in this case, added to circuit 200 of FIG. 2A. In more detail, circuit 290 also includes voltage level translator 250 and bypass circuit 252 as discussed with reference to FIG. 2A above, and power-down circuit 295 is coupled to voltage level translator 250 as shown. In the bypass mode, when bypass 232 is asserted, power-down circuit 295 is configured to selectively power down voltage level translator 250. But in the normal mode, when bypass 232 is not asserted (or in other words, when bypass_n 230 is asserted), power-down circuit 295 keeps voltage level translator 250 active for normal operation. Power-down circuit 295 will be explained in further detail below.

As shown, power-down circuit 295 also includes second pull-up transistor 282 configured similarly as second pull-up transistor 282 of power-down circuit 285 described above, and coupled between the second supply voltage VDD2 and voltage level translator 250 (e.g., to pull-up transistors 202 and 204 of voltage level translator 250, as shown), with the gate of second pull-up transistor 282 controlled by bypass 232. In the bypass mode, when bypass 232 is high, second pull-up transistor 282 is similarly turned off, thus gating off the voltage supply from the second supply voltage VDD2 to voltage level translator 250, causing node 222 and the signal y_n to float. Otherwise, in the normal mode, bypass 232 is low, causing second pull-up transistor 282 to be turned on and cause the second supply voltage VDD2 to be coupled to the voltage level translator 250 as normal.

Power-down circuit 295 also includes third pull-down transistor 294 coupled between voltage level translator 250 and ground, with the gate of third pull-down transistor 294 controlled by bypass_n 230. In the bypass mode, when bypass_n 230 is low, third pull-down transistor 294 is turned off, thus gating off a path to ground for voltage level translator 250. Otherwise, in the normal mode, bypass_n 230 is high, causing third pull-down transistor 294 to be turned on and cause voltage level translator 250 to be coupled to ground as normal.

Power-down circuit 295 can optionally include one of the two: fourth pull-down transistor 296 or fourth pull-up transistor 298, but not both, connected to node 222 of voltage level translator 250. If fourth pull-down transistor 296 is included in power-down circuit 295, the gate of fourth pull-down transistor 296 is controlled by bypass 232. In the bypass mode, when bypass 232 is high, fourth pull-down transistor 296 is turned on, thus connecting node 222 to ground or logic "0". In the normal mode, bypass 232 is low causing fourth pull-down transistor 296 to be turned off, removing any influence on node 222 or signal y_n.

On the other hand, if fourth pull-up transistor 298 is included in power-down circuit 295, the gate of fourth pull-up transistor 298 is controlled by bypass_n 230. In the bypass mode, when bypass_n 230 is low, fourth pull-up transistor 298 is turned on, thus connecting and node 222 to the second supply voltage VDD2 or logic "1". In the normal mode, bypass_n 230 is high, causing fourth pull-up transistor 298 to be turned off, removing any influence on node 222 or signal y_n. As will be appreciated, when either one of fourth pull-down transistor 296 or fourth pull-up transistor 298 are included in power-down circuit 295, configured as above, node 222 is prevented from floating in the bypass mode, which leads to a reduction in back coupling in bypass circuit 252, thereby improving performance of circuit 290 in the bypass mode.

Accordingly, in exemplary aspects, circuits such as circuit 270, 280, or 290 may be configured with power-down circuits 275, 285, or 295, respectively, to avoid power consumption when voltage level translator 250 is not used in the bypass mode. Circuit 270, 280, and 290 also include bypass circuit 252 to avoid delay through voltage level translator in the bypass mode.

Situations where the bypass mode is entered, to assert bypass 232 for example, can involve detection of the first and second voltage supplies VDD1 and VDD2 becoming substantially the same voltage value. This detection can be performed with methods and systems known in the art. For example, battery levels or charging conditions of a battery operated mobile device can be used to enter or exit the bypass mode. To illustrate, if a mobile device is plugged in to an external power source or if the battery level is high (or above a certain charge level) the mobile device may be programmed to support a high performance or turbo mode wherein the first and second voltage supplies VDD1 and VDD2 may be made substantially the same. However, if the battery level drops below a predetermined level to a low battery mode, for example, the separate voltage levels of the first and second voltage supplies VDD1 and VDD2 may be maintained and the bypass mode may be exited. Digital and/or analog circuits can be configured to detect the battery levels or connection to an external power source to correspondingly provide indications of whether the bypass mode may be selected or if normal operating conditions apply for a voltage level translator. In some examples, it may also be possible for a programmer or operating system to provide software controls which can be used to enter or exit the bypass mode. Various other options for detection or determination of a bypass mode (e.g., to assert bypass 232) will be recognized by skilled persons and therefore will not be discussed in further detail herein.

Figure 3:
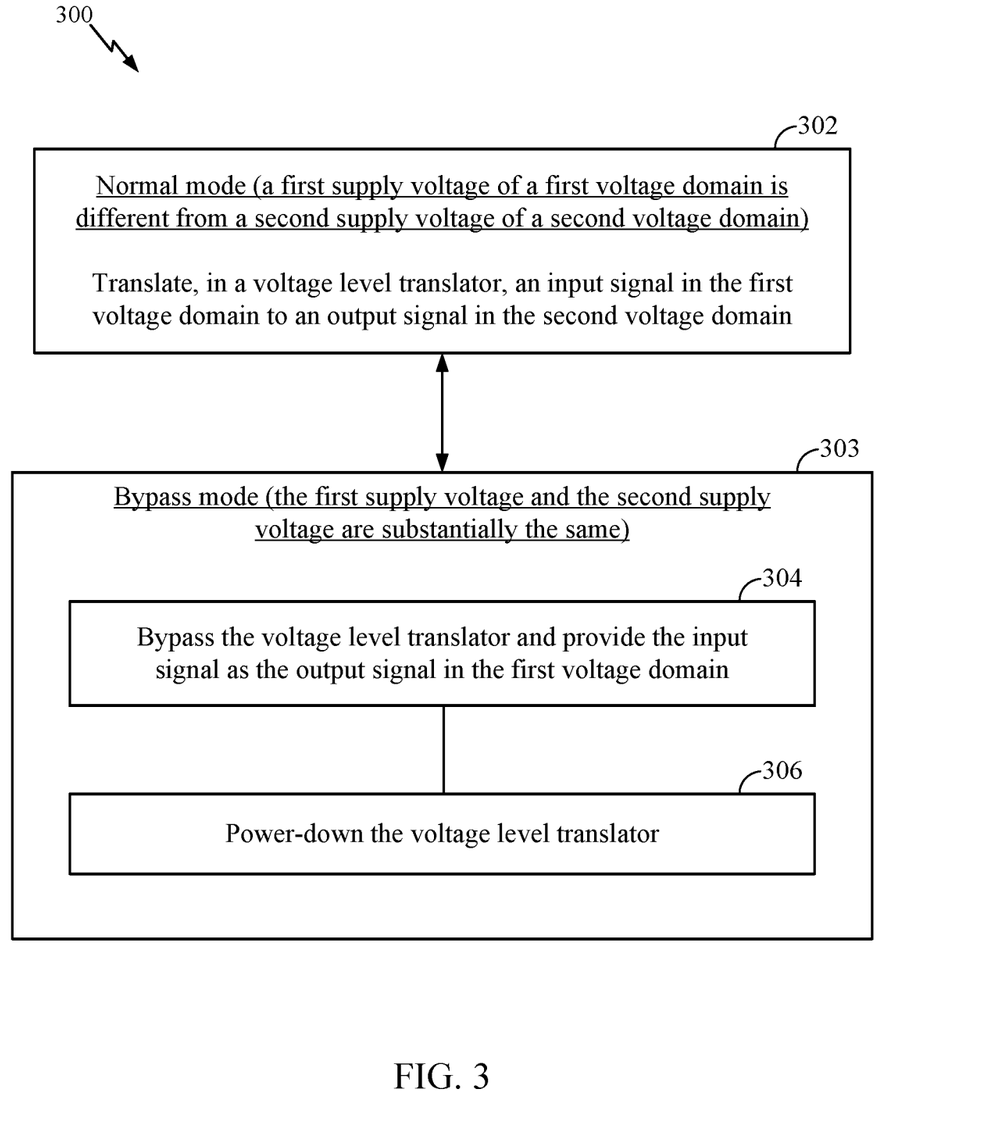
FIG. 3 illustrates a block diagram corresponding to a method of performing voltage level translation, according to exemplary aspects of this disclosure.

It will be appreciated that exemplary aspects include various methods for performing the processes, functions and/or algorithms disclosed herein. For example, as illustrated in FIG. 3, an exemplary aspect can include a method (300) of performing voltage level translation. Method 300 can include Block 302 pertaining to a normal mode of operation, e.g., of circuits 270, 280, or 290 and Block 303 can pertain to a bypass mode of operation, e.g., of circuits 270, 280, or 290. FIG. 3 shows a double-headed arrow between Blocks 302 and 303 to indicate that it is possible to transition from the normal mode to the bypass mode, or from the bypass mode to the normal mode as the case may be. These Blocks 302 and 303 will be explained in further detail below.

As mentioned, Block 302 can pertain to a normal mode of operation, wherein a first supply voltage VDD1 of a first voltage domain is different from a second supply voltage VDD2 of a second voltage domain. In the normal mode, Block 302 can include translating, e.g., in voltage level translator 250, an input signal, e.g., input signal a 214, in the first voltage domain to an output signal, e.g., output signal z 220, in the second voltage domain in a normal mode.

Block 303 can pertain to a bypass mode of operation, wherein the first and second supply voltages VDD1 and VDD2 are substantially the same. Block 303 can comprise Blocks 304 and 306, which may be performed simultaneously.

As such, Block 304 can include bypassing the voltage level translator and providing the input signal as the output signal in the first voltage domain in a bypass mode. For example, Block 304 can include bypassing voltage level translator 250 using bypass circuit 252 when bypass 232 is asserted and providing the input signal as the output signal in the first voltage domain.

Block 306 can include selectively powering-down the voltage level translator in the bypass mode. For example, Block 306 can include powering-down voltage level translator 250 (e.g., using power-down circuits 275, 285, or 295 depending on whether implementations for circuits 270, 280, or 290 are chosen in exemplary aspects). Specifically, using any of the power-down techniques discussed herein, voltage level translator 250 may be powered down in the bypass mode (when bypass 232 is high and bypass_n 230 is low) and voltage level translator 250 may be maintained active in the normal mode (when bypass 232 is low and bypass_n 230 is high). In this manner, method 300 can be used to avoid delay and power associated with voltage level translator 250 in circuit 270, 280, or 290 in the bypass mode when bypass 232 is asserted.

Figure 4:
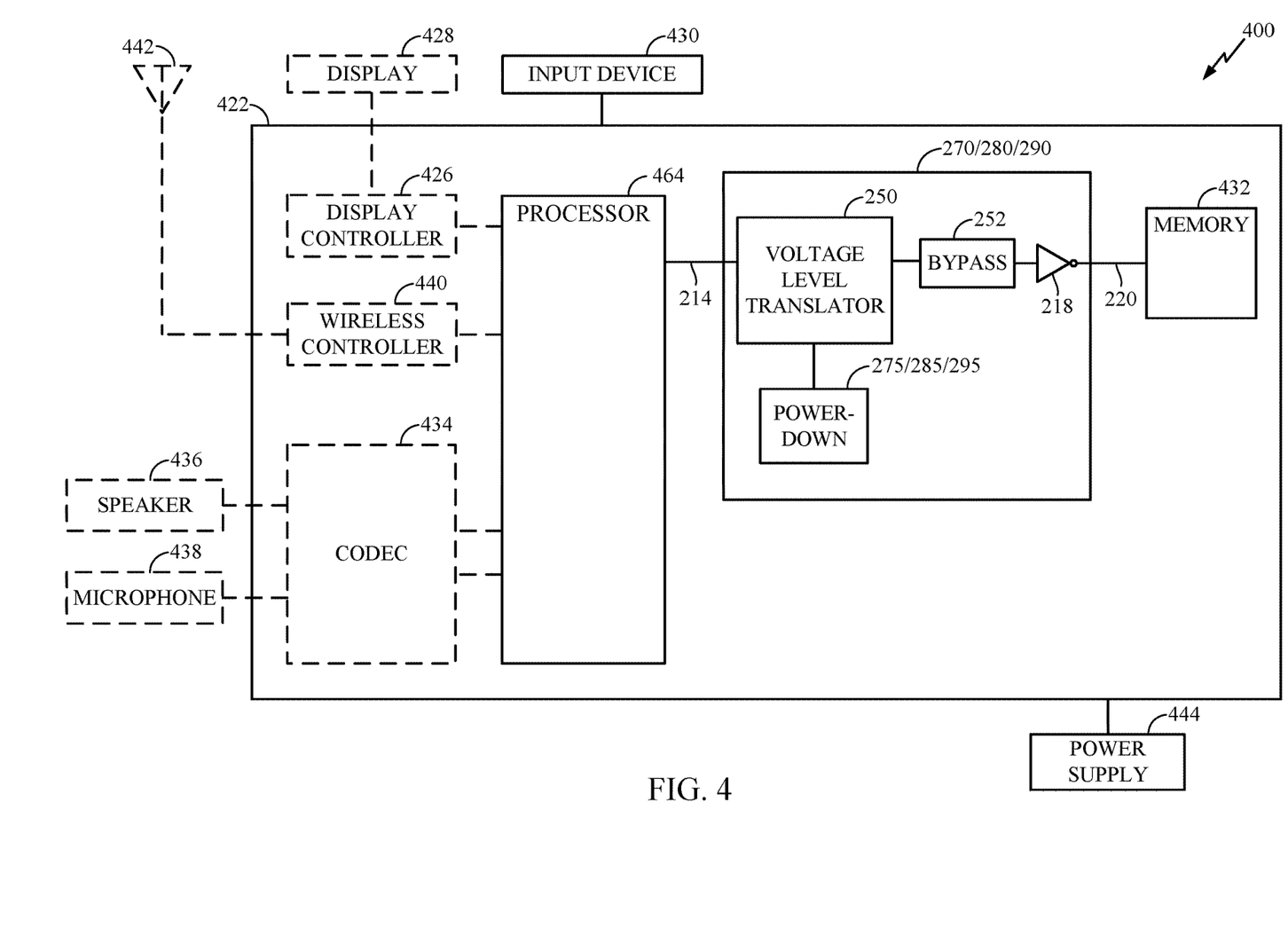
FIG. 4 illustrates an exemplary computing device in which an aspect of the disclosure may be advantageously employed.

Referring now to FIG. 4, a block diagram of a particular illustrative aspect of a computing device that includes a circuit such as circuit 270, 280, or 290 for power efficient voltage level translation is depicted and generally designated 400. Computing device 400 may include the functionality for performing method 300 discussed with reference to FIG. 3 above. Furthermore, in some aspects, computing device 400 may be configured as a wireless communication device.

Computing device 400 is shown to include processor 464 and memory 432. In some aspects, processor 464 may belong to a first or logic voltage domain with a first supply voltage VDD1 and memory 432 may belong to a second or memory voltage domain with a second supply voltage VDD2. Accordingly, a schematic of circuit 270, 280, or 290 described with reference to FIGS. 2B-D above is shown to be configured between processor 464 and memory 432. Circuit 270/280/290 may perform voltage level translation, e.g., of an input signal a 214 (e.g., corresponding to a read/write command from processor 464 to memory 432) to an output signal z 220, using voltage level translator 250 in a normal mode. Circuit 270/280/290 may be configured to bypass and power-down voltage level translator 250 using bypass circuit 252 and corresponding power-down circuit 275/285/295, to provide complementary input signals a 214 and a_n 216 from processor 464 as output signal z 220, without voltage level translation, to memory 432 in a bypass mode, wherein the first and second supply voltages VDD1 and VDD2 are substantially the same in the bypass mode. As previously mentioned, the bypass mode may correspond to a turbo mode as known in the art. It is noted that the representation of circuit 270/280/290 in FIG. 4 omits the various details shown in corresponding FIGS. 2B-D, for the sake of clarity.

Computing device 400 may also comprise display controller 426 that is coupled to processor 464 and to display 428. FIG. 4 also shows the optional aspects that may be provided in computing device 400. For example, computing device may optionally comprise coder/decoder (CODEC) 434 (e.g., an audio and/or voice CODEC) coupled to processor 464, with speaker 436 and microphone 438 coupled to CODEC 434; and wireless controller 440 (which may include a modem) coupled to processor 464, with wireless controller 440 coupled to wireless antenna 442.

In an example aspect where one or more of the above-mentioned optional features are present, processor 464, circuit 270/280/290, memory 432, CODEC 434, display controller 426, and wireless controller 440 can be included in a system-in-package or system-on-chip device 422. In some aspects, input device 430 and power supply 444 may be coupled to system-on-chip device 422 (where it is also noted that the first and second voltage supplies VDD1 and VDD2 may be derived or supplied from power supply 444 in some cases), while in some aspects, display 428, input device 430, speaker 436, microphone 438, wireless antenna 442, and power supply 444 may be external to system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 generally depicts a computing device, processor 464, and memory 432 may also be integrated into a set top box, music player, video player, entertainment unit, navigation device, communications device, personal digital assistant (PDA), fixed location data unit, mobile phone, a server, and a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for power-efficient voltage level translation. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. An apparatus comprising:
   a voltage level translator configured to translate an input signal in a first voltage domain to an output signal in a second voltage domain, in a normal mode wherein a first supply voltage of the first voltage domain is different from a second supply voltage of the second voltage domain;

a bypass circuit configured to bypass the voltage level translator and provide the input signal as the output signal in the first voltage domain based on a bypass signal, in a bypass mode wherein the first supply voltage and the second supply voltage are substantially the same and non-zero;

a power-down circuit configured to power-down, by cutting off a power supply to the voltage level translator, the voltage level translator in the bypass mode based on the bypass signal but not in the normal mode; and a circuit configured to connect an output node of the voltage level translator to a supply voltage or to ground in the bypass mode to prevent the output node from floating in the bypass mode, wherein the circuit comprises a fourth pull-up transistor configured to connect the output node of the voltage level translator to the second supply voltage in the bypass mode, wherein in the bypass mode, the voltage level translator is isolated from the second supply voltage and from ground.

2. The apparatus of claim 1, wherein the power-down circuit comprises a first pull-down transistor configured to gate off a ground connection to the voltage level translator in the bypass mode.

3. The apparatus of claim 2, wherein the power-down circuit comprises a first pull-up transistor configured to connect the output node of the voltage level translator to the second supply voltage in the bypass mode.

4. The apparatus of claim 1, wherein the power-down circuit comprises a second pull-up transistor configured to gate off a connection between the second supply voltage and the voltage level translator in the bypass mode.

5. The apparatus of claim 4, wherein the circuit comprises a second pull-down transistor configured to connect the output node of the voltage level translator to ground in the bypass mode.

6. The apparatus of claim 4, wherein the power-down circuit further comprises a third pull-down transistor configured to gate off a connection between the voltage level translator and ground in the bypass mode.

7. The apparatus of claim 6, wherein the circuit comprises a fourth pull-down transistor configured to connect the output node of the voltage level translator to ground in the bypass mode.

8. The apparatus of claim 1, wherein the bypass circuit comprises a multiplexer configured to select the input signal in the first voltage domain in the bypass mode and the output node of the voltage level translator in the second voltage domain in the normal mode.

9. The apparatus of claim 1, wherein the first voltage domain corresponds to a logic voltage domain comprising logic cells and the second voltage domain corresponds to a memory voltage domain comprising memory cells, wherein the bypass mode corresponds to a turbo mode.

10. The apparatus of claim 1, integrated in a device selected from the group consisting of a set top box, music player, video player, entertainment unit, navigation device, communications device, personal digital assistant (PDA), fixed location data unit, server, mobile phone, and a computer.

11. A method of voltage level translation, the method comprising:

translating, in a voltage level translator, an input signal in a first voltage domain to an output signal in a second voltage domain, in a normal mode wherein a first supply voltage of the first voltage domain is different from a second supply voltage of the second voltage domain;

bypassing the voltage level translator and providing the input signal as the output signal in the first voltage domain based on a bypass signal, in a bypass mode, wherein the first supply voltage and the second supply voltage are substantially the same and non-zero;

powering-down, by cutting off a power supply to the voltage level translator, the voltage level translator in the bypass mode but not in the normal mode based on the bypass signal; and connecting an output node of the voltage level translator to the second supply voltage or to ground in the bypass mode to prevent the output node from floating in the bypass mode, wherein connecting the output node of the voltage level translator to the second supply voltage comprises turning on a fourth pull-up transistor to connect the output node of the voltage level translator to the second supply voltage in the bypass mode, wherein in the bypass mode, the voltage level translator is isolated from the second supply voltage and from ground.

12. The method of claim 11, wherein powering-down the voltage level translator comprises turning off a first pull-down transistor to gate off the voltage level translator from a ground connection in the bypass mode.

13. The method of claim 12, wherein connecting the output node of the voltage level translator to the second supply voltage comprises turning on a first pull-up transistor to connect the output node of the voltage level translator to the second supply voltage in the bypass mode.

14. The method of claim 11, wherein powering-down the voltage level translator comprises turning off a second pull-up transistor configured to gate off a connection between the second supply voltage and the voltage level translator in the bypass mode.

15. The method of claim 14, wherein connecting the output node of the voltage level translator to ground comprises turning on a second pull-down transistor to connect the output node of the voltage level translator to ground in the bypass mode.

16. The method of claim 14, further comprising turning off a third pull-down transistor to gate off a connection between the voltage level translator and ground in the bypass mode.

17. The method of claim 16, wherein connecting the output node of the voltage level translator to ground comprises turning on a fourth pull-down transistor to connect the output node of the voltage level translator to ground in the bypass mode.

18. The method of claim 11, comprising selecting the input signal in the first voltage domain in the bypass mode and the output node of the voltage level translator in the second voltage domain in the normal mode.

19. The method of claim 11, wherein the first voltage domain corresponds to a logic voltage domain comprising logic cells and the second voltage domain corresponds to a memory voltage domain comprising memory cells, wherein the bypass mode corresponds to a turbo mode.

20. An apparatus comprising:

means for translating an input signal in a first voltage domain to an output signal in a second voltage domain, in a normal mode wherein a first supply voltage of the first voltage domain is different from a second supply voltage of the second voltage domain;

means for bypassing the means for translating, and providing the output signal in the first voltage domain in a bypass mode based on a bypass signal, wherein the first supply voltage and the second supply voltage are substantially the same and non-zero; and means for powering-down, by cutting off a power supply to the means for translating, the means for translating in the bypass mode but not in the normal mode based on the bypass signal; and means for connecting an output node of the means for translating to the second supply voltage or to ground in the bypass mode to prevent the output node from floating in the bypass mode, wherein the means for connecting comprises a fourth pull-up transistor configured to connect the output node of the means for translating to the second supply voltage in the bypass mode, wherein in the bypass mode, the means for translating is isolated from the second supply voltage and from ground.

21. The apparatus of claim 20, wherein the means for powering-down the means for translating comprises means for gating off the means for translating from a ground connection in the bypass mode.

22. The apparatus of claim 20, wherein the means for powering-down the means for translating comprises means for gating off a connection between the second supply voltage and the means for translating in the bypass mode.

23. The apparatus of claim 22, further comprising means for gating off a connection between the means for translating and ground in the bypass mode.

24. The apparatus of claim 20, further comprising means for selecting the input signal in the first voltage domain in the bypass mode and the output node of the means for translating in the second voltage domain in the normal mode.

* * * * *